United States Patent
Jabeur et al.

(10) Patent No.: US 11,037,645 B2
(45) Date of Patent: Jun. 15, 2021

(54) DYNAMIC BOOSTING TECHNIQUES FOR MEMORY

(71) Applicant: International Business Machines Corporation, Armonk, NY (US)

(72) Inventors: Kotb Jabeur, Essex Junction, VT (US); John Kenneth DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 16/451,992

(22) Filed: Jun. 25, 2019

(65) Prior Publication Data
US 2020/0411128 A1    Dec. 31, 2020

(51) Int. Cl.
*G11C 29/38* (2006.01)
*G11C 8/08* (2006.01)
*G11C 7/12* (2006.01)
*G06F 30/39* (2020.01)

(52) U.S. Cl.
CPC .......... *G11C 29/38* (2013.01); *G11C 7/12* (2013.01); *G11C 8/08* (2013.01); *G06F 30/39* (2020.01)

(58) Field of Classification Search
CPC .. G11C 29/38; G11C 7/12; G11C 8/08; G06F 30/39
See application file for complete search history.

(56) References Cited

U.S. PATENT DOCUMENTS

| | | | |
|---|---|---|---|
| 9,548,104 B1 | 1/2017 | Braceras et al. | |
| 9,741,410 B2 | 8/2017 | Chen et al. | |
| 9,922,726 B2 | 3/2018 | Choi | |
| 2010/0271891 A1* | 10/2010 | Dell | G11C 5/06 365/200 |
| 2010/0306582 A1* | 12/2010 | Han | G06F 11/1068 714/6.13 |
| 2016/0093364 A1 | 3/2016 | Jung et al. | |

OTHER PUBLICATIONS

Zimmer et al., SRAM assist techniques for operation in a wide voltage range in 28-nm CMOS, IEEE Transactions on Circuits and Systems II: Express Briefs, vol. 59, No. 12 (2012): 853-857.

* cited by examiner

*Primary Examiner* — Thien Nguyen
(74) *Attorney, Agent, or Firm* — Daniel Morris; Otterstedt, Wallace & Kammer, LLP (57) ABSTRACT

Memory devices incorporating selective boosting techniques and methods for managing memory devices incorporating selective boosting techniques. One or more bit cells of a memory device are tested during a test phase and one or more addresses of one or more weak bit cells are stored in a non-volatile weak bit address memory within the memory device.

15 Claims, 6 Drawing Sheets

DYNAMIC BOOSTING TECHNIQUES FOR MEMORY

BACKGROUND

The present invention relates to the electrical, electronic and computer arts, and more specifically, to memory devices.

In order to increase bit cell efficiency, read and write assist techniques are often utilized in memory devices. Voltage boosting is a common technique used in memory arrays to assist with read and write operations. In general, the technique of boosting consists of increasing the current through the bit cell by boosting the selection transistor gate voltage (WL), increasing the voltage difference between the source line and the bit line, or both. In practice, within the same memory device, the electrical characteristics of bit cells are not the same, mainly due to process variations. Thus, in practice, some cells require boosting while others do not.

SUMMARY

Principles of the invention provide techniques for the dynamic boosting of memory cells. In one aspect, an exemplary method includes the steps of testing one or more bit cells of a memory device during a test phase; and storing one or more addresses of one or more weak bit cells in a non-volatile weak bit address memory within the memory device.

In one aspect, a memory device comprises one or more bit cells; and a non-volatile weak bit address memory for storing one or more addresses of one or more weak bit cells, the one or more addresses discovered during a test phase.

In one aspect, an apparatus comprises a memory device, the memory device comprising: one or more bit cells; and a non-volatile weak bit address memory for storing one or more addresses of one or more weak bit cells, the one or more addresses discovered during a test phase.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

selective boosting of bit cells;
overall power saving for devices incorporating boosting;
improvement of overall reliability of a memory device by preventing unnecessary boosting of "good" bits; and
improvement of memory cell bit error rates due to selective boosting.

These and other features and advantages of the present invention will become apparent from the following detailed description of illustrative embodiments thereof, which is to be read in connection with the accompanying drawings.

DETAILED DESCRIPTION

Generally, techniques, devices, and methods for selectively controlling boosting of cells in a memory device are disclosed. In general, a "pre-knowledge" of weak cells identified during a testing phase is used to enable boosting of memory cells only when it is needed, for example, to meet product specifications of the memory device. This avoids the boosting of all cells of the memory, boosting all the time, or both and, consequently, it offers power saving. In addition, some bit cells have a bit error rate exceeding, for example, the specifications of a product. If these bit cells can be detected during the regular operation of the memory device by, for example, the use of an error correction code (ECC), the efficiency of the memory cell may be increased by, for example, boosting their voltage.

In one example embodiment, during the testing of the memory device, the addresses of weak bit cells (such as cells having error rates that exceed the manufacturer's specification for the memory device or bits that require a slightly higher writing voltage than defined by the component's specifications) are stored in the memory device to indicate that boosting should be applied when these bit cells are selected in the array. In one example embodiment, during the regular operation of the memory device, an ECC detector detects accesses to addresses of bit cells with high bit error rates and similarly stores their addresses in order to boost the corresponding bit cells each time these bit cells are selected.

More specifically, during the test phase of the memory device, the weak bit cells (such as bit cells that fail during testing) in the array are identified. If the bit cell did not store the data correctly during testing, the voltage across the bit cell is boosted during normal operation by using a memory boosting technique, such as word line voltage boosting, source line/bit line voltage boosting, and the like. The addresses of the bit cells needing a voltage boost are stored in a non-volatile memory. During the normal operation of the memory device, the data address to be accessed is compared with the addresses of weak bit cells. If there is a match, the boost system is activated for this address.

Some bit cells in the memory array may successfully pass during the test phase, and are therefore considered as "good" bit cells which do not require boosting. Some of the bit cells initially designated as "good," however, may have a higher write error rate (WER) or bit error rate (BER) than that required by an application, specified by the manufacturer, and the like (WER and BER are used interchangeably herein). In one example embodiment, an error correction code (ECC) detector detects and stores the address of bit cells with high write error rates with an indication of the bit cell being suspect. A supplementary non-volatile memory can be used to store the addresses of all suspected bit cells. The threshold of the write error rate, or a similar metric, that is used to identify suspect bit cells can be set, for example, by a user. For example, a storage application may specify a required write error rate. In one example embodiment, the voltage of the suspect bit cells will be boosted to achieve a lower WER and increased write efficiency when the corresponding bit cell is accessed.

Figure 1:
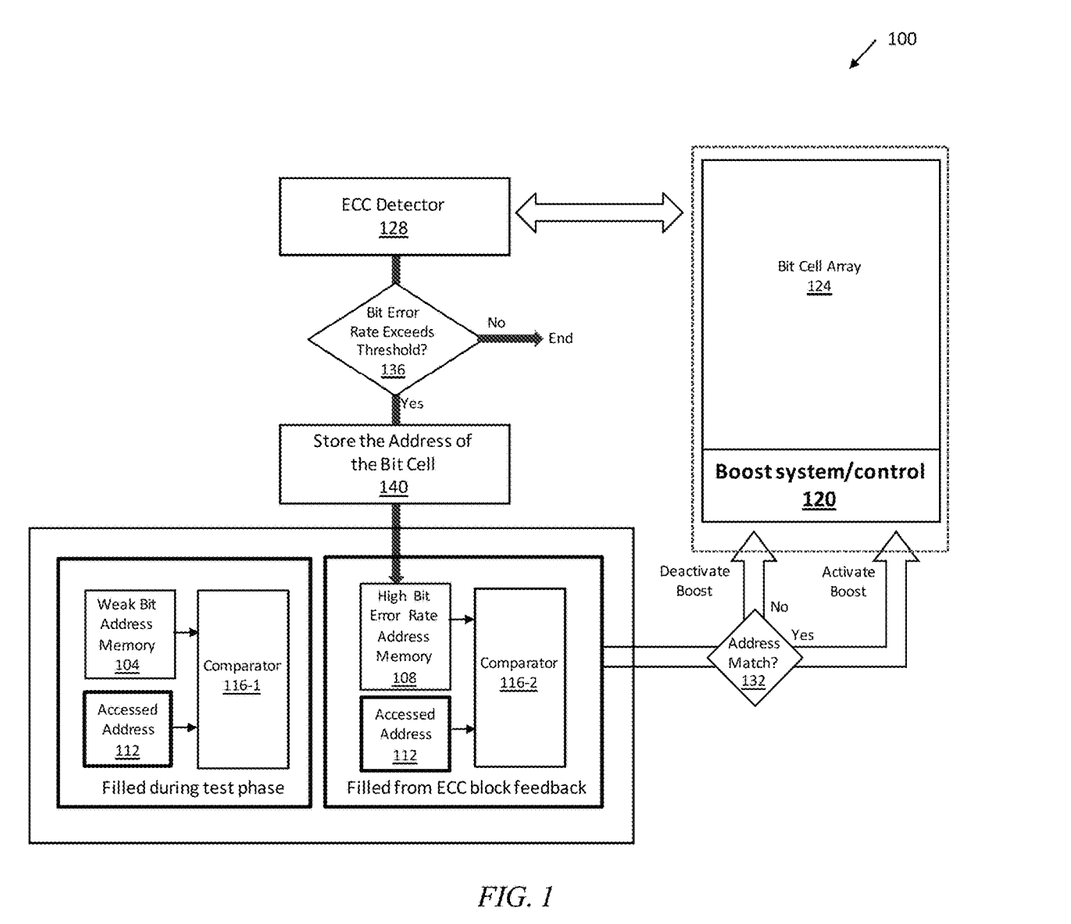
FIG. 1 is a workflow of an example system for selectively boosting memory cells, in accordance with an example embodiment.

FIG. 1 is a combined workflow and block diagram of an example system 100 for selectively boosting memory cells, in accordance with an example embodiment. During testing, the addresses of weak bits are stored in a (non-volatile) weak bit address memory 104. During normal operation, the addresses of high BER bits are stored in a (non-volatile) high BER address memory 108. During the normal access of a memory cell, the access address 112 of the memory cell is compared with the addresses stored in the weak bit cell address memory 104, the high BER address memory 108, or both by comparators 116-1 and 116-2, respectively. In one example embodiment, the comparison operations are performed by a single comparator (not shown). A check is performed to determine if the access address 112 matched an address in either the weak bit cell address memory 104 or the high BER address memory 108 (operation 132). If there is a match by at least one of the comparators 116-1 and 116-2, the boost system 120 for the bit cell array 124 is activated for the bit cell(s) corresponding to the access address 112; otherwise, the boost system 120 for the bit cell array 124 is not activated. In one example embodiment, the weak bit cell address memory 104 and the high BER address memory 108 are implemented as a single memory and redundant addresses are stored only once in the single memory.

If the normal access is a read operation (or a write operation that incorporates a read operation), an ECC detector 128 utilizes an error correction code to detect and, if possible, correct errors in the stored data. A check is performed to determine if the bit error rate corresponding to the accessed address exceeds a predefined threshold (operation 136). If the bit error rate corresponding to the accessed bit rate exceeds the predefined threshold, the corresponding address is stored in the high BER address memory 108.

In one example embodiment, the predefined threshold is set to less than the number of erroneous bits the ECC detector 128 is able to correct. For example, if the ECC detector 128 is able to correct four erroneous bits, the predefined threshold may be set to three or two or one, depending on how frequently boosting is desired. If the ECC detector 128 corrects a number of bits that exceeds the predefined threshold during a single memory access, the address is stored in the high BER address memory 108 (operation 140).

In one example embodiment, each time the ECC detector 128 detects a bit error for a given memory address, an error counter (not shown) corresponding to the given memory address is incremented. If the cumulative error counter corresponding to an address (after one or more memory accesses) exceeds a predefined threshold, such as two, the address is stored in the high BER address memory 108 (operation 140).

Figure 2:
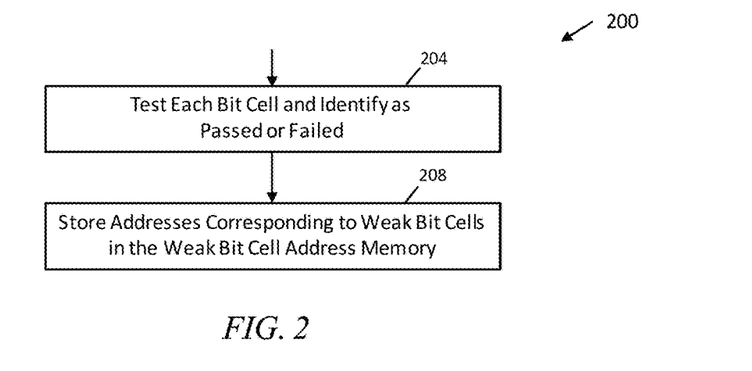
FIG. 2 is a flowchart of an example method for selecting bit cells of a memory device during a test phase, in accordance with an example embodiment.

FIG. 2 is a flowchart of an example method 200 for selecting bit cells of a memory device during a test phase, in accordance with an example embodiment. In one example embodiment, during the test phase of the memory device, each bit cell in the array is tested and identified as failing or passing (operation 204). The address of each bit cell identified as failing is stored in the weak bit cell address memory 104 (operation 208).

Figure 3:
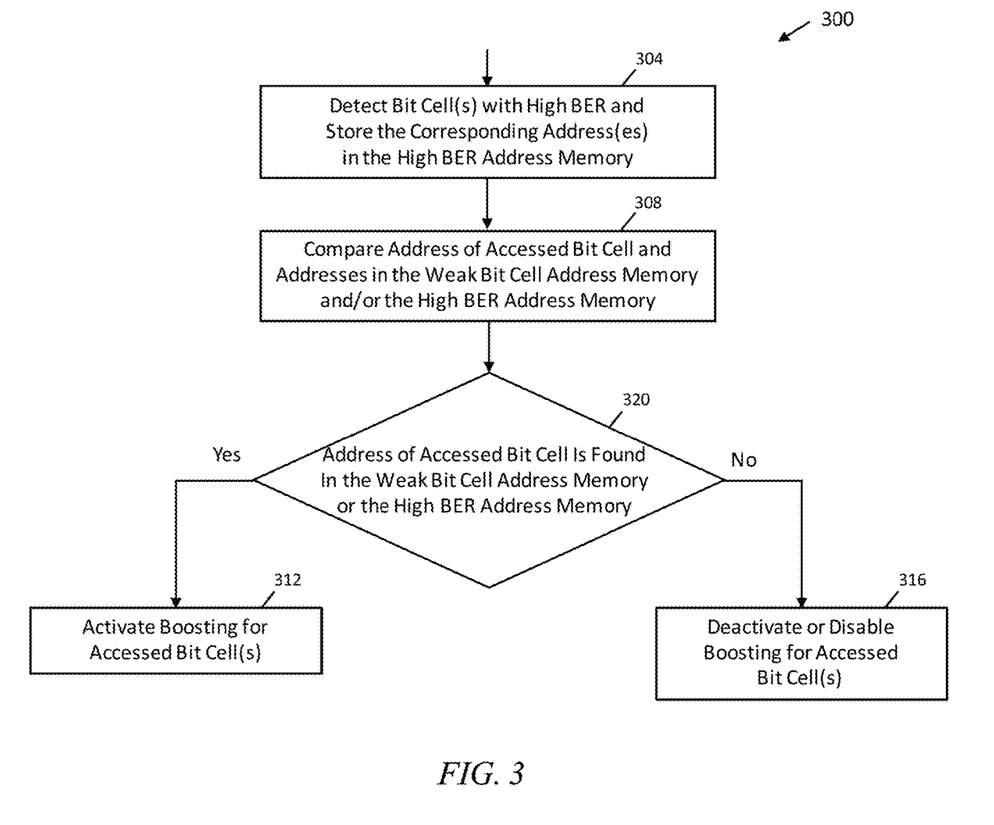
FIG. 3 is a flowchart of an example method for selecting bit cells of a memory device for boosting during an operational phase, in accordance with an example embodiment.

FIG. 3 is a flowchart of an example method 300 for selecting bit cells of a memory device for boosting during an operational phase, in accordance with an example embodiment. In one example embodiment, bit cells with a high bit error rate are detected by an error correction code (ECC) detector 128 and the address(es) of bit cell(s) with the high bit error rate(s) are stored in the high BER address memory 108 with an indication of the bit cell being suspect (operation 304). The high write error rate (WER) may be relative to that required by the application, to that specified by the manufacturer, and the like. A supplementary non-volatile memory can used to store the addresses of all suspected bit cells. The threshold of the write error rate, or a similar metric, that is used to identify suspect bit cells can be set, for example, by a user.

In one example embodiment, the address of the data to be accessed is compared with the weak bit cell addresses in the weak bit cell address memory 104 and/or the suspect bit cell addresses in the high BER address memory 108 (operation 308). A check is performed to determine if the address of the data to be accessed was found in either the weak bit cell address memory 104 or in the high BER address memory 108 (operation 320). If there is a match of the address of the data to be accessed with one of the weak bit cell addresses and/or one of the suspect bit cell addresses, the boost system is activated for this bit cell address using a memory boosting technique, such as word line voltage boost, source line/bit line voltage boost, and the like (operation 312 via YES branch); otherwise, the boost operation is deactivated or is disabled (operation 316 via NO branch). In one example embodiment, the voltage of the suspect bit cells is boosted for a lower WER/BER and increased write efficiency.

Given the discussion thus far, it will be appreciated that, in general terms, an exemplary method, according to an aspect of the invention, includes the steps of testing one or more bit cells of a memory device during a test phase (operation 204); and storing one or more addresses of one or more weak bit cells in a non-volatile weak bit address memory 104 within the memory device (operation 208).

In one aspect, a memory device comprises one or more bit cells 124; and a non-volatile weak bit address memory 104 for storing one or more addresses of one or more weak bit cells, the one or more addresses discovered during a test phase.

In one aspect, an apparatus comprises a memory device, the memory device comprising: one or more bit cells 124; and a non-volatile weak bit address memory 104 for storing one or more addresses of one or more weak bit cells, the one or more addresses discovered during a test phase.

In one example embodiment, the steps further comprise detecting one or more high bit error rate (BER) bit cells during a non-test phase (operation 304); storing one or more addresses corresponding to the one or more high bit error rate bit cells in a non-volatile high BER address memory (operation 304); comparing, during the non-test phase, an address 112 of a bit cell being accessed and the addresses stored in the weak bit cell address memory 104 and the high BER address memory 108 (operation 308); and activating boosting of the accessed bit cell in response to the address 112 of the bit cell being accessed matching at least one address in the weak bit cell address memory 104 or the high BER address memory 108 (operation 312) and deactivating boosting of the accessed bit cell in response to the address 112 of the bit cell not matching any address in the weak bit cell address memory 104 and not matching any address in the high BER address memory 108 (operation 316). In one example embodiment, the boosting comprises one of word line voltage boosting and source line/bit line voltage boosting. In one example embodiment, each high bit error rate bit cell is a bit cell 124 having a BER that exceeds a specified threshold during a given memory access. In one example embodiment, the specified threshold is set by a user.

In one example embodiment, the weak bit cell address memory 104 and the high BER address memory 108 are implemented as a single memory and redundant addresses are written only once to the single memory. In one example embodiment, the steps further comprise maintaining a count of bit errors corresponding to the bit cell 124 being accessed, wherein each high bit error rate bit cell is a bit cell 124 having a cumulative count of bit errors that exceeds a specified threshold during one or more memory accesses.

In one example embodiment, the memory device further comprises a non-volatile high BER address memory 108 for storing one or more addresses corresponding to one or more high bit error rate bit cells discovered during a non-test phase. In one example embodiment, the memory device further comprises a processing circuit 116-1, 116-2 for comparing an address 112 of a bit cell 124 being accessed with the addresses stored in the weak bit cell address memory 104 and the high BER address memory 108; and activating boosting of the accessed bit cell in response to the address 112 of the bit cell 124 matching at least one address in the weak bit cell address memory 104 or the high BER address memory 108 and deactivating boosting of the accessed bit cell 124 in response to the address 112 of the bit cell 124 not matching any address in the weak bit cell address memory 104 and not matching any address in the high BER address memory 108.

In one example embodiment, the memory device further comprises a counter for maintaining a count of bit errors corresponding to the bit cell 124 being accessed, wherein each high bit error rate bit cell is a bit cell 124 having a count of bit errors that cumulatively exceeds a specified threshold during one or more memory accesses.

In one or more embodiments, a further step includes fabricating a physical integrated circuit. One non-limiting specific example of accomplishing this is described elsewhere herein in connection with FIGS. 4-6. For example, a design structure, based on the above design, is provided to fabrication equipment to facilitate fabrication of a physical integrated circuit in accordance with the design structure.

In one or more embodiments, a layout is prepared based on the above design.

In one or more embodiments, the layout is instantiated as a design structure.

In one or more embodiments, a physical integrated circuit is fabricated in accordance with the design structure.

As noted, in one or more embodiments, the layout is instantiated as a design structure. See discussion of FIG. 4. A physical integrated circuit is then fabricated in accordance with the design structure. See again discussion of FIG. 4. Refer also to FIG. 5. Once the physical design data is obtained, an integrated circuit designed in accordance therewith can be fabricated according to known processes that are generally described with reference to FIG. 5. Generally, a wafer with multiple copies of the final design is fabricated and cut (i.e., diced) such that each die is one copy of the integrated circuit. At block 810, the processes include fabricating masks for lithography based on the finalized physical layout. At block 820, fabricating the wafer includes using the masks to perform photolithography and etching. Once the wafer is diced, testing and sorting each die is performed at 830 to filter out any faulty die.

Figure 7:
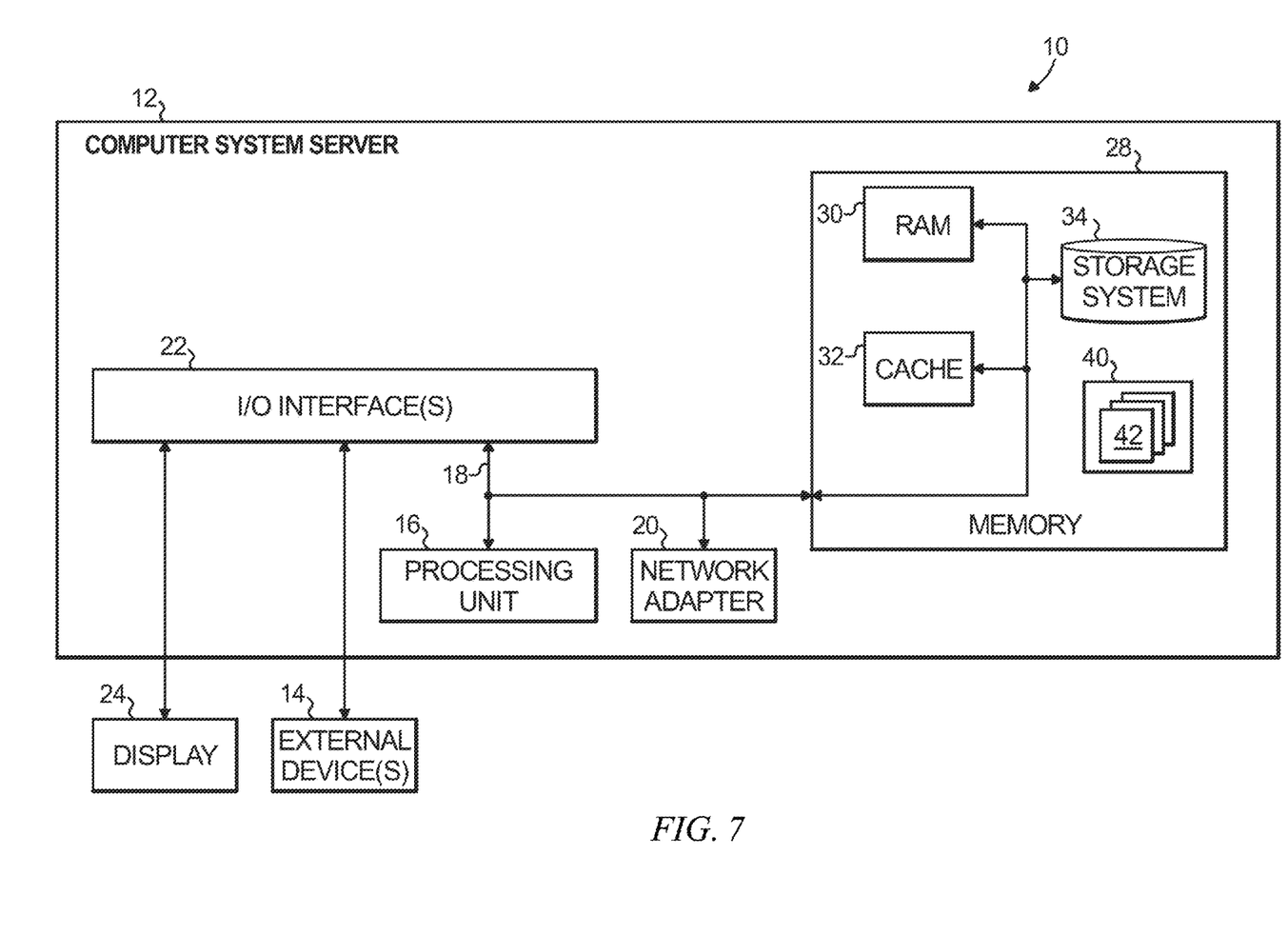
FIG. 7 depicts a computer system that may be useful in implementing one or more aspects and/or elements of the invention.

Referring to FIG. 7, one or more embodiments include a computer including a memory 28; and at least one processor 16, coupled to the memory, and operative to carry out or otherwise facilitate any one, some, or all of the method steps described herein (e.g. to conduct/control an analysis, test and/or fabrication process).

Figure 4:
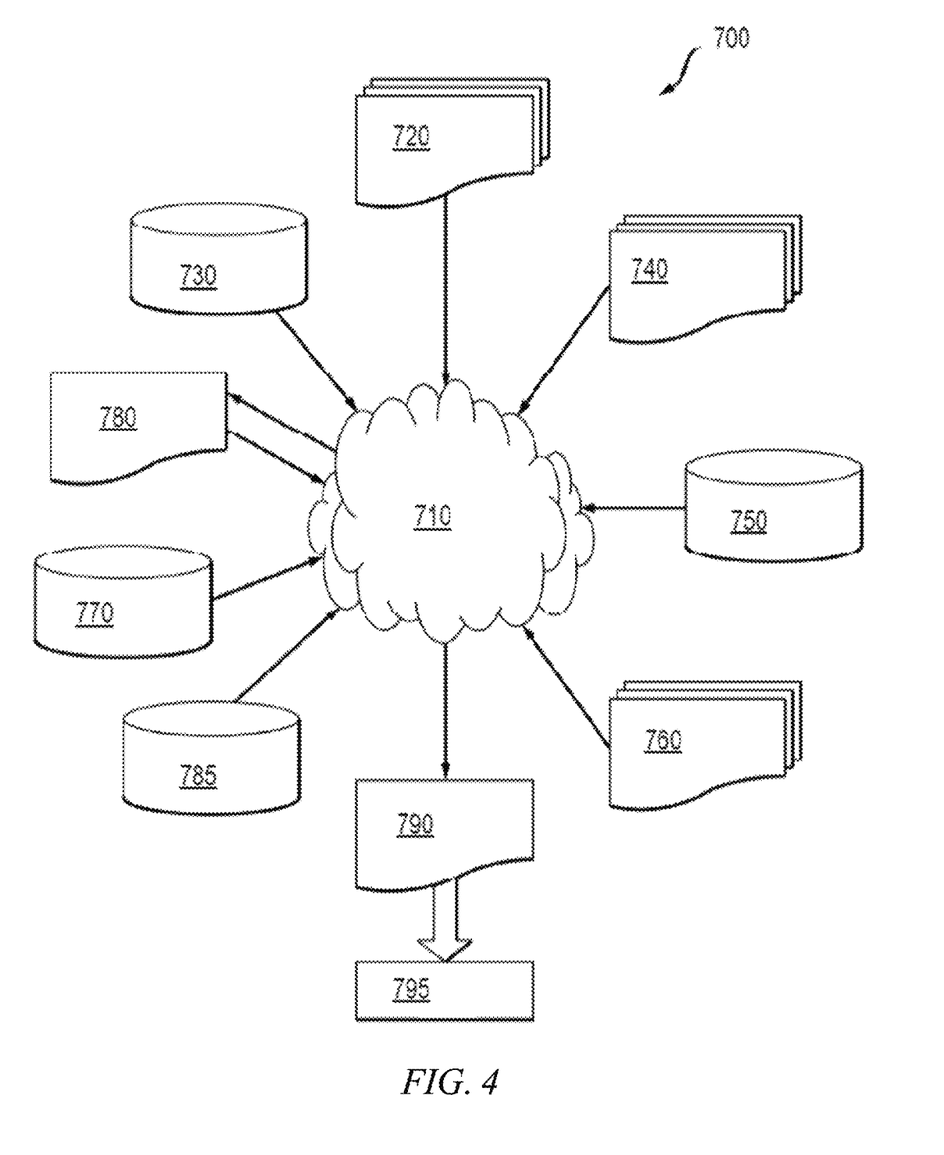
FIG. 4 is a flow diagram of a design process used in semiconductor design, manufacture, and/or test.
Figure 5:
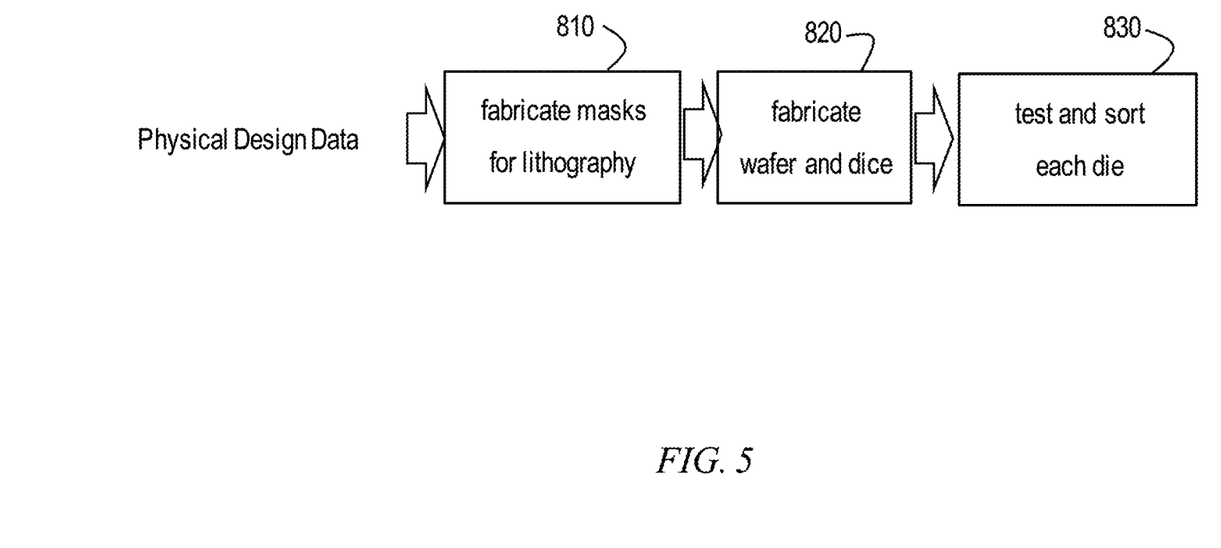
FIG. 5 shows further aspects of IC (integrated circuit) fabrication from physical design data.

Furthermore, referring to FIG. 4, in one or more embodiments the at least one processor is operative to generate a design structure for the integrated circuit design, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of the voltage boosting) compared to circuits designed using prior art techniques.

Figure 6:
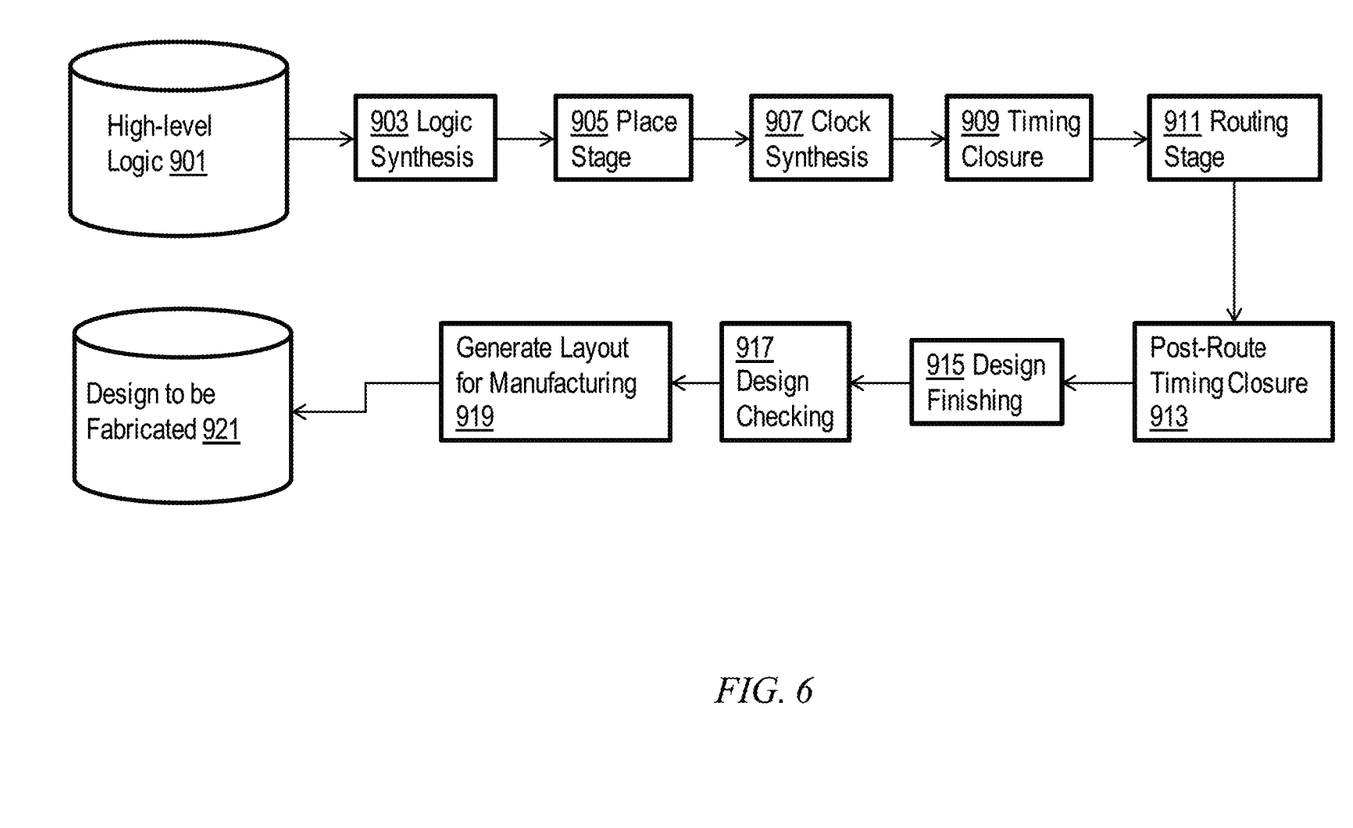
FIG. 6 shows an exemplary high-level Electronic Design Automation (EDA) tool flow, within which aspects of the invention can be employed.

FIG. 6 depicts an example high-level Electronic Design Automation (EDA) tool flow, which is responsible for creating an optimized microprocessor (or other IC) design to be manufactured. A designer could start with a high-level logic description 901 of the circuit (e.g. VHDL or Verilog). The logic synthesis tool 903 compiles the logic, and optimizes it without any sense of its physical representation, and with estimated timing information. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, or noise. When the design is clean, the final step 919 is to generate a layout for the design, representing all the shapes to be fabricated in the design to be fabricated 921.

One or more embodiments of the invention, or elements thereof, can be implemented in the form of an apparatus including a memory and at least one processor that is coupled to the memory and operative to perform exemplary method steps. FIG. 7 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 7, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 7) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 4 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Exemplary System and Article of Manufacture Details

Aspects discussed in this section relate, for example, to embodiments wherein a computer carries out or otherwise facilitates any one, some, or all of the method steps described herein (e.g. to conduct/control an analysis, test and/or fabrication process).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   testing one or more bit cells of a memory device during a test phase;
   storing one or more addresses of one or more weak bit cells in a non-volatile weak bit address memory within the memory device;
   detecting one or more high bit error rate (BER) bit cells during a non-test phase;
   storing one or more addresses corresponding to the one or more high bit error rate bit cells in a non-volatile high BER address memory;
   comparing, during the non-test phase, an address of a bit cell being accessed and the addresses stored in the weak bit cell address memory and the high BER address memory; and
   activating boosting of the accessed bit cell in response to the address of the bit cell being accessed matching at least one address in the weak bit cell address memory or the high BER address memory and deactivating boosting of the accessed bit cell in response to the address of the bit cell not matching any address in the weak bit cell address memory and not matching any address in the high BER address memory.

2. The method of claim 1, wherein said boosting comprises one of word line voltage boosting and source line/bit line voltage boosting.

3. The method of claim 1, wherein each high bit error rate bit cell is a bit cell having a BER that exceeds a specified threshold during a given memory access.

4. The method of claim 1, wherein the specified threshold is set by a user.

5. The method of claim 1, wherein the weak bit cell address memory and the high BER address memory are implemented as a single memory and redundant addresses are written only once to the single memory.

6. The method of claim 1, further comprising maintaining a count of bit errors corresponding to the bit cell being accessed, wherein each high bit error rate bit cell is a bit cell having a cumulative count of bit errors that exceeds a specified threshold during one or more memory accesses.

7. A memory device comprising:
one or more bit cells;
a non-volatile weak bit address memory for storing one or more addresses of one or more weak bit cells, the one or more addresses discovered during a test phase;
a non-volatile high BER address memory for storing one or more addresses corresponding to one or more high bit error rate bit cells discovered during a non-test phase; and
a processing circuit for comparing an address of a bit cell being accessed with the addresses stored in the weak bit cell address memory and the high BER address memory;
and activating boosting of the accessed bit cell in response to the address of the bit cell matching at least one address in the weak bit cell address memory or the high BER address memory and deactivating boosting of the accessed bit cell in response to the address of the bit cell not matching any address in the weak bit cell address memory and not matching any address in the high BER address memory.

8. The memory device of claim 7, wherein the memory boosting technique is one of word line voltage boosting and source line/bit line voltage boosting.

9. The memory device of claim 7, wherein each high bit error rate bit cell is a bit cell having a BER that exceeds a specified threshold during a given memory access.

10. The memory device of claim 9, wherein the specified threshold is set by a user.

11. The memory device of claim 7, wherein the weak bit cell address memory and the high BER address memory are implemented as a single memory and redundant addresses are written only once to the single memory.

12. The memory device of claim 7, further comprising a counter for maintaining a count of bit errors corresponding to the bit cell being accessed, wherein each high bit error rate bit cell is a bit cell having a count of bit errors that cumulatively exceeds a specified threshold during one or more memory accesses.

13. An apparatus comprising a memory device, the memory device comprising:
one or more bit cells;
a non-volatile weak bit address memory for storing one or more addresses of one or more weak bit cells, the one or more addresses discovered during a test phase;
a non-volatile high BER address memory for storing one or more addresses corresponding to one or more high bit error rate bit cells discovered during a non-test phase; and
a processing circuit for comparing an address of a bit cell being accessed with the addresses stored in the weak bit cell address memory and the high BER address memory;
and activating boosting of the accessed bit cell in response to the address of the bit cell matching at least one address in the weak bit cell address memory or the high BER address memory and deactivating boosting of the accessed bit cell in response to the address of the bit cell not matching any address in the weak bit cell address memory and not matching any address in the high BER address memory.

14. The apparatus of claim 13, wherein each high bit error rate bit cell is a bit cell having a BER that exceeds a specified threshold during a given memory access.

15. The apparatus of claim 13, the memory device further comprising a counter for maintaining a count of bit errors corresponding to the bit cell being accessed, wherein each high bit error rate bit cell is a bit cell having a count of bit errors that cumulatively exceeds a specified threshold during one or more memory accesses.

\* \* \* \* \*